United States Patent [19]

Compagne

[11] Patent Number: 5,239,195
[45] Date of Patent: Aug. 24, 1993

[54] MOS TRANSISTOR WITH HIGH THRESHOLD VOLTAGE

[75] Inventor: Eric Compagne, La Tronche, France

[73] Assignee: Hello S.A., Paris, France

[21] Appl. No.: 700,702

[22] Filed: May 15, 1991

[30] Foreign Application Priority Data

May 17, 1990 [FR] France .................. 90 06408

[51] Int. Cl.⁵ ...................... H01L 23/62; H01L 29/76
[52] U.S. Cl. .................. 257/360; 257/361; 257/362; 257/409
[58] Field of Search .................. 357/23.4, 23.8, 23.12, 357/23.13; 257/360, 361, 362, 409

[56] References Cited

U.S. PATENT DOCUMENTS

| | | | |
|---|---|---|---|
| 4,525,378 | 6/1985 | Schwabe et al. | 357/23.12 |
| 4,692,781 | 9/1987 | Rountree et al. | 357/23.13 |
| 4,819,045 | 4/1989 | Murakami | 357/23.8 |
| 4,916,500 | 4/1990 | Yazawa et al. | 357/23.8 |
| 4,987,465 | 1/1991 | Longcor et al. | 357/41 |
| 4,990,983 | 2/1991 | Custode et al. | 357/23.8 |
| 5,047,820 | 9/1991 | Garnett | 357/23.8 |

FOREIGN PATENT DOCUMENTS

| | | | |
|---|---|---|---|
| 161983 | 11/1985 | European Pat. Off. | 257/360 |
| 217525 | 4/1987 | European Pat. Off. | 257/361 |
| 53-112069 | 9/1978 | Japan | 357/23.12 |
| 56-19671 | 2/1981 | Japan | 357/23.12 |
| 56-124258 | 9/1981 | Japan | 357/23.12 |
| 57-106078 | 7/1982 | Japan | 357/23.12 |
| 62-101074 | 5/1987 | Japan | 357/23.12 |
| 63-129657 | 6/1988 | Japan | 357/23.12 |

OTHER PUBLICATIONS

1986 EOS/ESD Symposium Proceedings, "Design and Test results for a robust CMOS VLSI input protection network", by Nelson et al., pp. 188-192.

Y. P. Tsividis, *Operation and Modeling of the MOS Transistor*, McGraw-Hill Book Company, 1985, Sections 10.3 and 10.4, pp. 417-433.

*Primary Examiner*—Rolf Hille
*Assistant Examiner*—Steven Loke
*Attorney, Agent, or Firm*—Kinney & Lange

[57] ABSTRACT

Disclosed is a MOS transistor with high threshold voltage comprising, in a semiconductor substrate with a first type of conductivity, surface drain and source regions with the second type of conductivity having a high doping concentration, separated by a thick oxide zone in which there is formed, in the substrate, an over-doped region with the first type of conductivity. Each of the drain and source regions is inserted in a well with the second type of conductivity, having a low doping concentration, formed in the substrate.

5 Claims, 1 Drawing Sheet

MOS TRANSISTOR WITH HIGH THRESHOLD VOLTAGE

BACKGROUND OF THE INVENTION

1. Field of the Invention

The present invention relates to the making, in an integrated circuit, of a MOS transistor with high threshold voltage.

A large number of logic MOS transistors are formed in a MOS type integrated circuit. These logic MOS transistors commonly have threshold voltages in the range of some volts. However, in a circuit such as this, it may be useful to have MOS transistors with appreciably higher threshold voltages, of the order of some tens of volts, for example to act as input protection diodes.

Transistors such as these are also necessary to make output transistors for a circuit that has to permanently undergo operating voltages, at its drain and gate, that are greater than the supply voltages of the circuit.

2. Description of the Prior Art

To make MOS transistors with high threshold voltages, structures such as the one shown schematically in FIG. 1 have been used in the prior art. This figure shows a MOS transistor including, in a P− type semiconductor substrate, a source region 2 and a drain region 3 of the N+ type. The gate 4 is formed on a thick oxide or field oxide zone 5, corresponding to the oxide zones normally designed to separate the MOS transistors of an integrated circuit from one another. A source metallization 6 and a drain metallization 7 are also shown. P type channel barrier regions 8 are formed beneath the thick oxide regions external to the high threshold voltage transistor, as well as an overdoped region 9, corresponding to these channel barrier regions, beneath the thick oxide of the gate 4.

To form a protection device, this MOS transistor is connected as a diode, i.e. the drain 3 and the gate 4 are interconnected, as are the source and the substrate.

In principle, a transistor having the structure shown in FIG. 1 exhibits a high threshold voltage owing to its high gate thickness and the enhancement of the channel region. In certain technologies, this threshold voltage may be of the order of 30 to 50 volts. Nevertheless, in practice, this diode-connected transistor will exhibit a far smaller threshold voltage for it is the N+P−(or P−N+) junctions between the drain or the source and the substrate that will break down first, for example at a voltage of the order of 10 to 15 volts, if the P−substrate has a doping concentration of the order of $10^{15}$ atoms/cm$^3$ and the drain and source regions have a doping concentration of the order of $10^{20}$ at./cm$^3$.

Thus, if it is desired to manufacture a MOS transistor with high threshold voltage in association with an integrated circuit comprising complementary transistors, there are two possible approaches: either to make zones with a particular doping concentration, distinct from the zones used elsewhere in the integrated circuit, which entails technological steps in addition to the standard steps of manufacture of the integrated circuit, or else to make a device external to the integrated circuit. Both these approaches are costly.

SUMMARY OF THE INVENTION

An aim of the present invention is to provide a MOS transistor with high threshold voltage, it being possible to make this MOS transistor in an integrated circuit with CMOS (complementary MOS) transistors without the need for technological steps in addition to the standard steps of fabrication of the CMOS integrated circuit.

Another aim of the invention is to provide a transistor such as this, limiting the risks of breakdown of the different junctions, even in the presence of a high threshold voltage.

Another aim of the invention is to provide a transistor such as this, capable of working in the presence of high useful voltages applied permanently.

To achieve these aims, the present invention provides for a MOS transistor with high threshold voltage comprising, in a semiconductor substrate having a first type of conductivity, surface drain and source regions having the second type of conductivity with a high doping concentration separated by a zone of thick oxide beneath which there is formed, in the substrate, an overdoped region with the first type of conductivity, each of the drain and source regions being inserted in a well of the second type of conductivity, with a low doping concentration formed in the substrate, and the upper part of each of the wells including, beneath the thick oxide zone, between each of the drain and source regions and the overdoped zone, a region having the second type of conductivity with a mean doping concentration.

In this way, all the risks of breakdown of the different junctions existing in the transistor are averted, by means of buffer zones with an intermediate doping concentration. And, in other words, the opposite zones of conductivity with high doping gradient are insulated.

A transistor according to the present invention preferably forms part of an integrated circuit including MOS transistors with channels of the second type of conductivity and MOS transistors with channels of the first type of conductivity formed in wells made in the substrate. In this case, the drain and source regions of the transistor with high threshold voltage correspond to the drain and source regions of the transistors with channels having the second type of conductivity; and the regions of the second type of conductivity with mean doping concentration correspond to channel barrier dopings of the complementary transistors.

One of the advantages of a structure such as this is that all the operations of implantation, diffusion and oxidation needed for the fabrication of the MOS transistor with high threshold voltage according to the invention, are operations which, in any case, are carried out during the fabrication of a CMOS transistor formed on the same substrate as the transistor according to the invention. These transistors may notably be used at input of circuits liable to be subjected to high useful voltages, or at output of circuits standing up to operating voltages greater than the supply voltages of the circuit.

BRIEF DESCRIPTION OF THE DRAWINGS

These and other objects, features and advantages of the present invention shall be explained in greater detail in the following description of particular embodiments, made with reference to the appended drawings, of which.

In these figures, it will be noted that, in line with the usual practice in the depiction of integrated circuits, the horizontal and vertical dimensions of the various layers have been arbitrarily contracted or expanded in order to make it easier to read the figures without excessively increasing the space occupied by them.

DETAILED DESCRIPTION OF THE INVENTION

Figure 2:
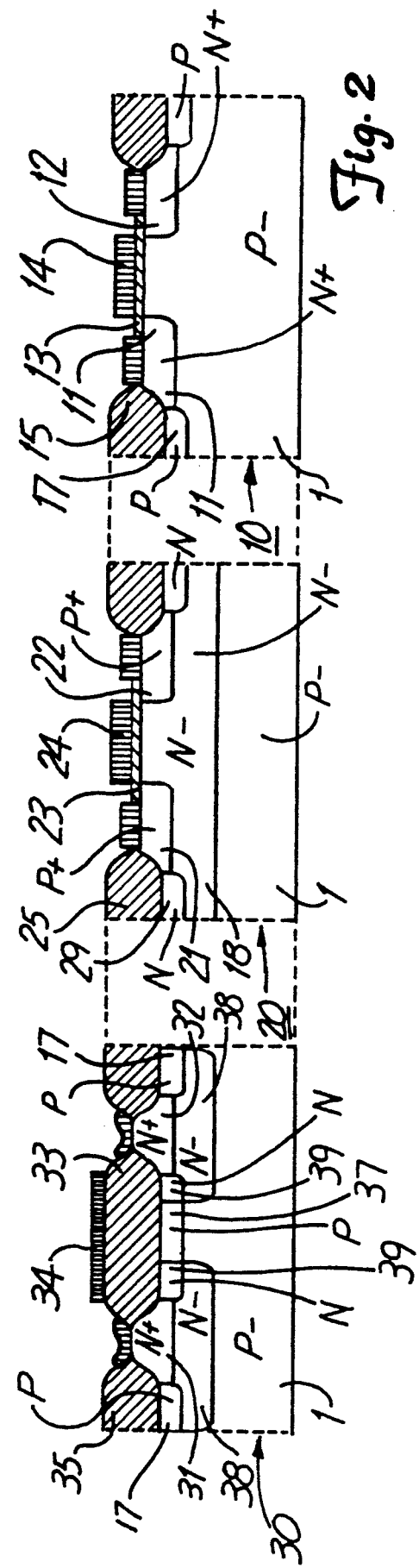
FIG. 2 shows a schematic sectional view of integrated circuit portions wherein the left-hand side corresponds to a MOS transistor with high threshold voltage according to the present invention.

FIG. 2 shows components of an integrated circuit. Among these components there are: to the right, a standard N channel MOS transistor 10, in the center, a standard P channel complementary transistor 20 and, to the left, a MOS transistor with high threshold voltage 30 according to the present invention.

All these transistors are formed in a P type silicon substrate 1 with a low doping concentration, marked P—, the doping concentration of which is, for example, of the order of $10^{15}$ at./cm$^3$.

In this P substrate, the N channel MOS transistor 10 includes N+ drain and source regions 11 and 12 separated by a substrate region above which there is formed a thin gate oxide 13 and a gate conductor 14. The transistor 10 is separated from its neighbours by a thick oxide region 15, beneath which there is usually formed a channel barrier region of a type opposite that of the drain and source regions, in this case a P type region 17. For example, the doping concentration of the region 17 is of the order of $10^{17}$ at./cm$^3$ while the N+ drain and source regions 11 and 12 exhibit a doping concentration of the order of $10^{20}$ at./cm$^3$.

The P channel complementary transistor 20 is formed in an N—well 18 which is itself formed in the substrate 1. This N—well exhibits, for example, a doping concentration of the order of $5 \times 10^{15}$ at./cm$^3$. It has P+ type drain and source regions 21 and 22, a gate insulation thin oxide 23 and a gate conductor 24. Adjacent transistors are separated by a thick oxide region 25 beneath which there is a channel barrier layer 29, of the same type of conductivity (N), and of a type opposite that of the drain and source regions 21 and 22. In a standard embodiment, the N—well 18 will have a doping concentration of the order of $5.10^{15}$ at./cm$^3$, the channel barrier regions will have a doping concentration of the order of $10^{17}$ at./cm$^3$ and the drain and source regions 21 and 22 will have a doping concentration of the order of $10^{20}$ at./cm$^3$.

Figure 1:
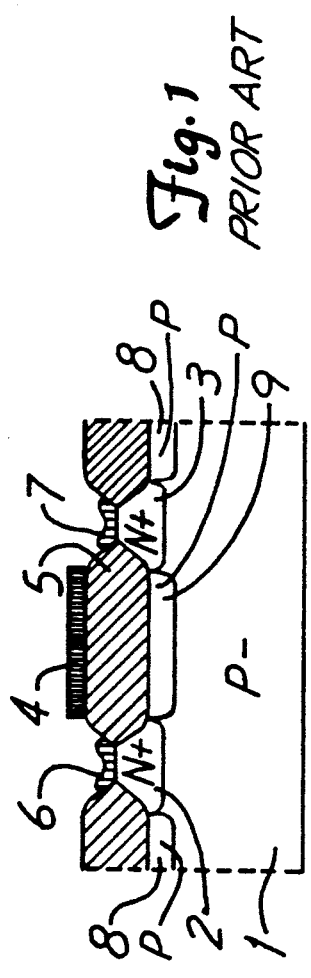
FIG. 1, described here above, shows a MOS transistor with high threshold voltage according to the prior art.

The transistor 30 according to the present invention, shown at the left-hand side of FIG. 2, includes drain and source regions 31 and 32 separated by a channel region surmounted by a thick oxide 33 covered with a gate conductor 34. The thick oxide 33 corresponds to the insulation thick oxide 35 between this transistor and its neighbors. In the channel region, a P type overdoped region 37 is formed. Thus, like the transistor shown in FIG. 1, this MOS transistor will have a high threshold voltage because its gate insulator is thick and its channel region is enhanced. Furthermore, the present invention provides for placing each of the drain and source regions 31 and 32 in a small N type weakly doped (N—) well 38 completely surrounding the overdoped drain and source regions 31 and 32. Thus, the creation of N+P— diodes, liable to exhibit a lower reverse breakdown voltage than the threshold voltage of the transistor, is avoided. To prevent the risk of breakdown of the N+P junction between the drain/source region 31, 32 and the enhanced channel region 37, buffer regions 39 with an intermediate doping concentration are formed on the surface of the well 38. Thus, in the structure shown, in the transistor 30, there is no longer any transition between zones having opposite types of conductivity, with a very high doping gradient.

The transistor 30 according to the invention may be manufactured without the involvement of any technological step in addition to that of the manufacture of the complementary MOS transistors 10 and 20. For, the drain and source regions 31 and 32 of the transistor 30 correspond to the drain and source regions 11 and 12 of the transistor 10. The N— trenches 38 correspond to the N— well 18 of the transistor 20. The channel enhancement zone 37 corresponds to the channel barrier zone 17 of the transistor 10. And the N type zone with intermediate doping concentration 39 corresponds to the channel barrier zone 29 of the transistor 20. Examples of doping concentrations of these different regions have been indicated here above.

A transistor such as this may have many applications in integrated circuits. It may be used, for example:

at the inputs of a circuit at which high useful voltages may be applied permanently (operation in passive mode);

at the outputs of a circuit, making it possible to stand up to operating voltages, at its gate and drain, that are greater than the supply voltages of the circuits (operation in active mode);

in other applications, notably within a circuit itself.

Although a particular embodiment of the invention has been described herein, those skilled in the art will, without going beyond the scope of the invention, be able to make a variety of improvements and modifications thereto in a manner that shall be naturally apparent to them. For example, all the types of conductivity could be interchanged.

Furthermore, the gate conductor could correspond to one of the levels of polycrystalline silicon or of metallization provided in integrated circuit fabrication technology. This will generally result in different threshold voltages since the thickness of the thick oxide layer 33 will be different in these different cases.

What is claimed is:

1. A MOS transistor with high threshold voltage of at least ten volts, for inclusion in an integrated circuit, including:
   a substrate of a first type of conductivity with a first low doping concentration having a principal surface,
   a surface drain region and a surface source region of a second type of conductivity opposite said first type of conductivity with a first high doping concentration, extending to said principal surface of the substrate and being spaced apart from each other,
   a thick oxide region extending between said surface drain and source regions,
   a first well region of said second type of conductivity with a second low doping concentration formed in said substrate and surrounding said surface drain region,
   a second well region of said second type of conductivity with said second low doping concentration formed in said substrate and surrounding said surface source region,
   a channel region of the first type of conductivity with a second high doping concentration formed in said substrate, said channel region extending laterally beneath a central part of said oxide region, and between the first and second wall regions, a first buffer region of said second type of conductivity with an intermediate doping concentration higher than said second low doping concentration and lower than said first high doping concentration, said first buffer region being formed in said first well region as a lateral continuation of the channel region, so as to separate said surface drain region from said channel region, said well region separating said surface drain region and said first buffer region from said substrate, and a second buffer region of said second type of conductivity with said intermediate doping concentration, said second buffer region being formed in said second well region as a lateral continuation of the channel region, so as to separate said surface source region from said channel region, said second well region separating said surface source region and said second buffer region from said substrate.

2. A high threshold voltage transistor according to claim 1, forming part of an integrated circuit made according to a CMOS technology comprising a series of steps and providing for two types of complementary MOS transistors including first MOS transistors with channel regions of the second type of conductivity and second MOS transistors with channel regions of the first type of conductivity formed in wells made in the substrate, wherein:

said surface drain and source regions of the high threshold voltage transistor are made during the same step and have the same doping concentration as the drain and source regions of said first transistors;

said first and second wells of the high threshold voltage transistor are made during the same step and have the same doping concentration as the wells of said second MOS transistors;

said channel region of the high threshold voltage transistor is made during the same step and has the same doping concentration as first channel barrier regions of said first MOS transistors, said first channel barrier regions extending under a thick oxide region separating first transistors from neighboring transistors; and said first and second buffer regions of the second type of conductivity with an intermediate doping concentration are made during the same step and have the same doping concentration as second channel barrier regions of said second MOS transistors, said second channel barrier regions extending under a thick oxide region separating second transistors from neighboring transistors.

3. The use of a transistor according to claim 2, for the input of an integrated circuit to which high useful voltages are liable to be applied permanently.

4. The use of a transistor according to claim 1, for the input of an integrated circuit to which high useful voltages are liable to be applied permanently.

5. In a MOS transistor having a substrate having a low doping concentration of a first type of conductivity, surface drain and source regions having high doping concentrations of a second type of conductivity opposite the first type of conductivity, first and second well regions having a low doping concentration of said second type of conductivity separating the respective drain and source regions from the substrate, the improvement comprising:

an overdoped channel region extending laterally between the first and second well regions and having a doping concentration of said first type of conductivity higher than the low doping concentration of the first type of conductivity, a first buffer region separating the drain region from the channel region, and a second buffer region separating the source region from the channel region, the first and second buffer regions being formed in the respective first and second well regions as lateral continuations of the channel region and having a doping concentration of said second type of conductivity intermediate the high and low doping concentrations of the second type of conductivity.

* * * * *

UNITED STATES PATENT AND TRADEMARK OFFICE
CERTIFICATE OF CORRECTION

PATENT NO. : 5,239,195
DATED : August 24, 1993
INVENTOR(S) : ERIC COMPAGNE

It is certified that error appears in the above-identified patent and that said Letters Patent is hereby corrected as shown below:

Col. 5, line 3, delete "wall", insert --well--

Signed and Sealed this

Eighth Day of March, 1994

Attest:

BRUCE LEHMAN

Attesting Officer      Commissioner of Patents and Trademarks